United States Patent
Sakaguchi et al.

(10) Patent No.: US 10,353,415 B2
(45) Date of Patent: Jul. 16, 2019

(54) VOLTAGE REGULATOR HAVING AN OVERHEAT DETECTION CIRCUIT AND TEST TERMINAL

(71) Applicant: ABLIC Inc., Chiba-shi, Chiba (JP)

(72) Inventors: Kaoru Sakaguchi, Chiba (JP); Kazuhiro Tsumura, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/938,316

(22) Filed: Mar. 28, 2018

(65) Prior Publication Data

US 2018/0284821 A1    Oct. 4, 2018

(30) Foreign Application Priority Data

Mar. 30, 2017  (JP) ................ 2017-068172

(51) Int. Cl.
| | |
|---|---|
| G05F 1/567 | (2006.01) |
| G05F 1/575 | (2006.01) |
| G01R 31/30 | (2006.01) |
| H02H 5/04 | (2006.01) |
| G01R 31/28 | (2006.01) |

(52) U.S. Cl.
CPC .............. *G05F 1/567* (2013.01); *G05F 1/575* (2013.01); *G01R 31/2855* (2013.01); *G01R 31/2874* (2013.01); *G01R 31/3004* (2013.01); *H02H 5/044* (2013.01)

(58) Field of Classification Search
CPC .... G05F 1/567; H02H 5/044; G01R 31/2855; G01R 31/2874; G01R 31/3004
See application file for complete search history.

(56) References Cited

U.S. PATENT DOCUMENTS

| | | | | |
|---|---|---|---|---|
| 2003/0020095 | A1* | 1/2003 | Akiyama | G01R 31/2856 257/200 |
| 2005/0083028 | A1* | 4/2005 | McClure | G05F 3/242 323/313 |
| 2008/0030914 | A1* | 2/2008 | Jahelka | G01K 7/015 361/103 |
| 2008/0192398 | A1* | 8/2008 | Inoue | G05F 1/56 361/103 |
| 2010/0321845 | A1* | 12/2010 | Imura | G05F 1/569 361/86 |
| 2013/0113447 | A1* | 5/2013 | Kadanka | G05F 1/56 323/280 |

FOREIGN PATENT DOCUMENTS

JP    H04-274504 A    9/1992

* cited by examiner

*Primary Examiner* — Harry R Behm
(74) *Attorney, Agent, or Firm* — Brinks Gilson & Lione

(57) ABSTRACT

To provide a voltage regulator capable of switching a voltage of an output terminal from an internal voltage to an external voltage while suppressing an increase in circuit scale. The voltage regulator includes a voltage output circuit configured to generate a constant internal voltage lower than an external voltage applied to an input terminal from the external voltage and supplying the constant internal voltage to an output terminal, a temperature sensing circuit configured to decrease an output voltage of an output node thereof according to a rise in temperature, an overheat detection circuit connected to the output node of the temperature sensing circuit and a test terminal, and a voltage detection circuit connected to the output node of the temperature sensing circuit and the test terminal.

15 Claims, 7 Drawing Sheets

VOLTAGE REGULATOR HAVING AN OVERHEAT DETECTION CIRCUIT AND TEST TERMINAL

RELATED APPLICATIONS

This application claims priority under 35 U.S.C. § 119 to Japanese Patent Application No. 2017-068172 filed on Mar. 30, 2017, the entire content of which is hereby incorporated by reference.

BACKGROUND OF THE INVENTION

1. Field of the Invention

The present invention relates to a voltage regulator.

2. Description of the Related Art

There has heretofore been disclosed in, for example, Japanese Patent Application Laid-Open No. H04-274504, a voltage regulator generating a constant internal voltage lower than an external voltage applied to an external terminal (input terminal) and supplying the same to an output terminal, in which the voltage of the output terminal is switched from the internal voltage to the external voltage to perform a stress test of an external circuit connected to the output terminal or to perform a stress test of an output transistor of the voltage regulator by applying a large voltage (voltage between external terminal and ground terminal) to the output transistor.

SUMMARY OF THE INVENTION

In the voltage regulator illustrated in Japanese Patent Application Laid-Open No. H04-274504, however, in order to switch the voltage of the output terminal from the internal voltage to the external voltage, there is a need to add a dedicated test terminal, thereby leading to an increase in circuit scale.

It is an object of the present invention to provide a voltage regulator capable of switching a voltage of an output terminal from an internal voltage to an external voltage while suppressing an increase in circuit scale.

In one embodiment of the present invention, there is provided a voltage regulator including: a voltage output circuit configured to generate a constant internal voltage lower than an external voltage applied to an input terminal from the external voltage and to an output terminal; a temperature sensing circuit configured to decrease an output voltage of an output node thereof according to a rise in temperature; an overheat detection circuit connected to the output node of the temperature sensing circuit and a test terminal; and a voltage detection circuit connected to the output node of the temperature sensing circuit and the test terminal, the voltage output circuit being configured to stop supplying the constant internal voltage based on an output stop signal supplied from the overheat detection circuit according to the output voltage of the temperature sensing circuit and a voltage of the test terminal which are lower than a first voltage, and being configured to output the external voltage to the output terminal based on a test mode signal supplied from the voltage detection circuit according to the voltage of the test terminal which is higher than a second voltage which is higher than both the output voltage of the temperature sensing circuit and the first voltage.

According to the present invention, the voltage regulator having an overheat protection circuit (the circuit including the temperature sensing circuit and the overheat detection circuit in the above) generally installed in the voltage regulator and a test terminal for testing it, further includes the voltage detection circuit connected to the test terminal. The voltage detection circuit outputs the test mode signal when a voltage input to the test terminal is higher than the second voltage which is higher than the first voltage for testing the overheat protection circuit, and the voltage output circuit outputs an external voltage to an output terminal based on the test mode signal. It is therefore possible to output the external voltage to the output terminal without providing a dedicated terminal. Since there is no need to add the dedicated terminal, it is thus possible to switch the voltage of the output terminal from the internal voltage to the external voltage while suppressing an increase in circuit scale.

BRIEF DESCRIPTION OF THE DRAWINGS

Embodiments of the invention will now be described, by way of example, with reference to the accompanying drawings, in which.

DETAILED DESCRIPTION OF THE EMBODIMENTS

The invention will now be described herein with reference to illustrative embodiments.

Figure 1:
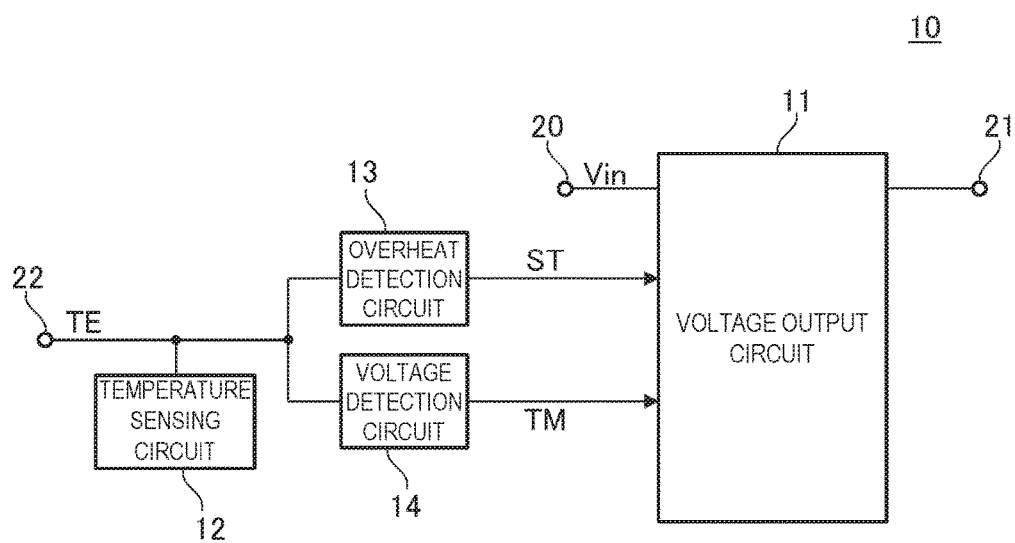
FIG. 1 is a block diagram for describing a voltage regulator according to an embodiment of the present invention.

FIG. 1 is a block diagram for describing a voltage regulator 10 according to an embodiment of the present invention.

The voltage regulator 10 according to the present embodiment includes an input terminal 20, an output terminal 21, a test terminal 22, a voltage output circuit 11, a temperature sensing circuit 12, an overheat detection circuit 13, and a voltage detection circuit 14.

The voltage output circuit 11 generates a constant internal voltage lower than an external voltage Vin applied to the input terminal 20 from the external voltage Vin and supplies it to the output terminal 21.

A test signal TE is applied to the test terminal 22.

The temperature sensing circuit 12 decreases an output voltage of an output node according to a rise in temperature. Further, the output node of the temperature sensing circuit 12 is connected to the test terminal 22.

The overheat detection circuit 13 has an input node connected to the output node of the temperature sensing circuit 12 and the test terminal 22 and outputs an output stop signal ST to the voltage output circuit 11.

The voltage detection circuit 14 has an input node connected to the output node of the temperature sensing circuit 12 and the test terminal 22 and outputs a test mode signal TM to the voltage output circuit 11.

Further, an overheat protection circuit is configured by the temperature sensing circuit 12, the overheat detection circuit 13, and an output stop circuit (not illustrated) in the voltage output circuit 11.

The operation of the voltage regulator 10 of the above-mentioned configuration will be described below.

A description will first be made to operation relating to the overheat protection circuit of the voltage regulator 10.

In normal operation, rise of the temperature of the voltage regulator 10 decreases the output of the temperature sensing circuit 12 accordingly. Further, the output voltage of the temperature sensing circuit lower than the first voltage causes the overheat detection circuit 13 to activate the output stop signal ST.

The output stop circuit in the voltage output circuit 11 thereby stops supplying the constant internal voltage to the output terminal 21. It is thus possible to protect the voltage regulator 10 from an overheated state.

When testing the overheat protection circuit to determine the first voltage, a voltage near the first voltage is applied to the test terminal 22 as the test signal TE to examine a voltage at which the overheat protection circuit (overheat detection circuit 13) starts operating (stops supplying the constant internal voltage to the output terminal 21). The operation start voltage of the overheat protection circuit which is obtained from the result of such a test is assumed to be a first voltage anew and set to the overheat detection circuit 13.

A description will next be made about operation where a test mode for switching the voltage of the output terminal 21 in the voltage regulator 10 from an internal voltage to the external voltage Vin applied to the input terminal 20. This test mode is intended for, for example, execution of a stress test of an external circuit (not illustrated) connected to the output terminal 21, and execution of a stress test of an output transistor (not illustrated) in the voltage output circuit 11 of the voltage regulator 10 by applying a large voltage to the output transistor, etc.

In the test mode, a voltage higher than a second voltage higher than the output voltage of the temperature sensing circuit 12 and the first voltage set to the overheat detection circuit 13 is applied to the test terminal 22 as the test signal TE.

The voltage detection circuit 14 thereby activates the test mode signal TM. Based on it, the voltage output circuit 11 outputs the external voltage Vin applied to the external terminal 20 to the output terminal 21.

According to the present embodiment, the test terminal 22 normally used for testing of the overheat protection circuit can thus be served also as a terminal for applying the signal for the test mode in which the voltage of the output terminal 21 of the voltage regulator 10 is switched from the internal voltage to the external voltage Vin. Accordingly, the above test mode can be realized while suppressing addition of a terminal, i.e., an increase in circuit scale.

Although the configuration and operation of the present embodiment have been described above, specific examples of the respective circuits illustrated in FIG. 1 will be described below to explain the present embodiment in more detail.

Figure 2:
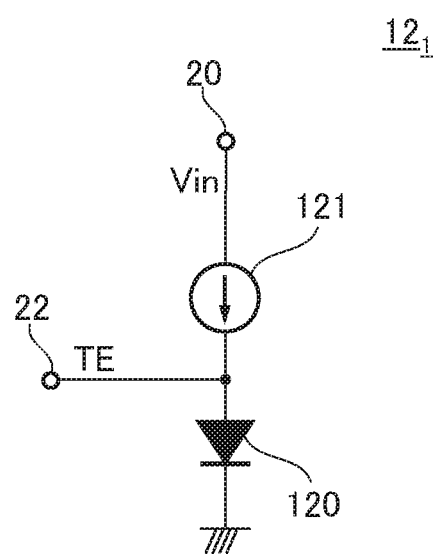
FIG. 2 is a circuit diagram illustrating a specific example of a temperature sensing circuit in the voltage regulator illustrated in FIG. 1.

FIG. 2 is a circuit diagram illustrating a temperature sensing circuit 12₁ being one specific example of the temperature sensing circuit 12 in the voltage regulator 10 illustrated in FIG. 1.

The temperature sensing circuit 12₁ has a current source 121 having one end connected to an input terminal 20 to which an external voltage Vin is applied, and the other end connected to the output node, that is the test terminal 22, and a diode element 120 connected in a forward direction between the test terminal 22 and a ground terminal. The diode element 120 functions as a temperature sensing element.

With the above-mentioned configuration, rise of the temperature decreases the voltage of the test terminal 22.

Although there is illustrated the example in which the external voltage Vin is supplied to one end of the current source 121 as a power supply voltage, the present example is not limited to it. A voltage generated inside the voltage regulator 10 may be used as the power supply voltage.

Figure 3:
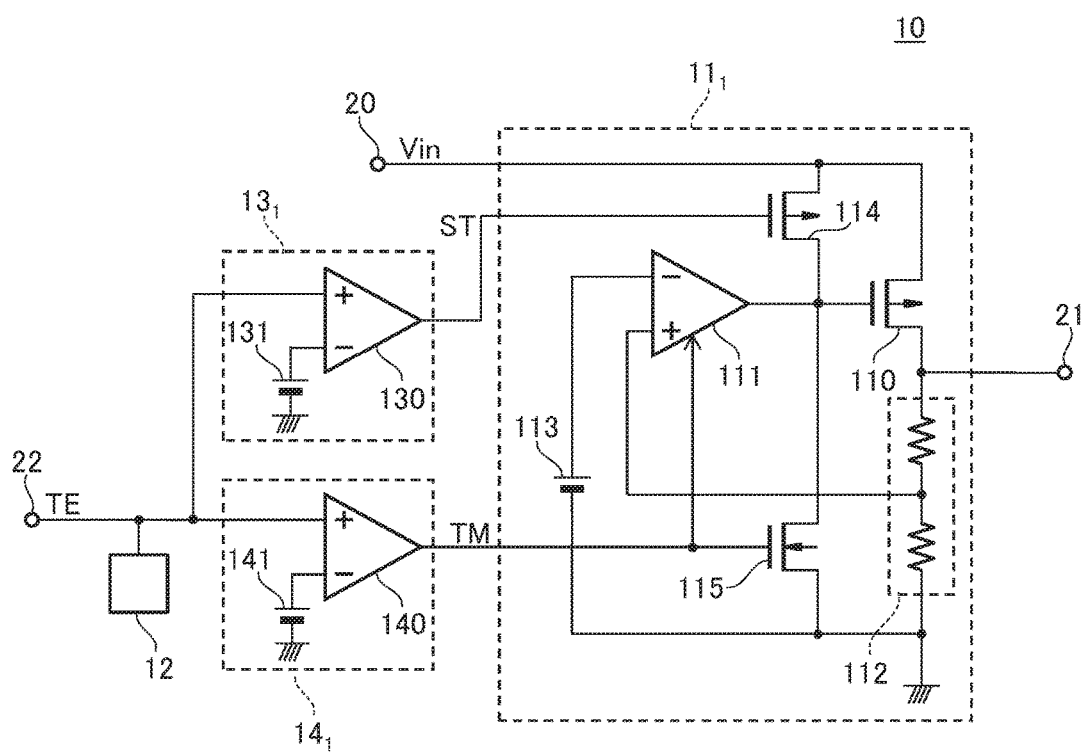
FIG. 3 is a circuit diagram illustrating a first specific example of each of a voltage output circuit and a voltage detection circuit and a specific example of an overheat detection circuit in the voltage regulator illustrated in FIG. 1.

FIG. 3 is a circuit diagram illustrating a voltage output circuit 11₁ and a voltage detection circuit 14₁ which are first specific examples of the voltage output circuit 11 and the voltage detection circuit 14 in the voltage regulator 10 illustrated in FIG. 1, and an overheat detection circuit 13₁ being one specific example of the overheat detection circuit 13. The same reference numerals are respectively attached to the same components as those in the voltage regulator 10 illustrated in FIG. 1, and redundant description will be omitted as appropriate.

The voltage output circuit 11₁ has an output transistor 110, an error amplifier 111, a resistance voltage dividing circuit 112, a reference voltage source 113, a PMOS transistor 114, and an NMOS transistor 115.

The output transistor 110 has a source connected to an input terminal 20 and a drain connected to an output terminal 21.

The resistance voltage dividing circuit 112 is connected between the output terminal 21 and a ground terminal.

The error amplifier 111 has a non-inversion input terminal received a divided voltage divided by the resistance voltage dividing circuit 112, and an inversion input terminal received a reference voltage of the reference voltage source 113.

The PMOS transistor 114 has a gate received the output stop signal ST, a source connected to the input terminal 20, and a drain connected to a gate of the output transistor 110. Here, the PMOS transistor 114 functions as the output stop circuit mentioned in the description of FIG. 1.

The NMOS transistor 115 has a gate to which the test mode signal TM is applied, a source connected to the ground terminal, and a drain connected to the gate of the output transistor 110.

In the voltage output circuit 11₁ with the above-mentioned configuration, the gate of the output transistor 110 is controlled based on a voltage supplied from the error amplifier 111 received a voltage based on the voltage of the output terminal 21, and the reference voltage of the reference voltage source 113, so that a constant internal voltage lower than an external voltage Vin applied to the input terminal 20 can be supplied to the output terminal 21.

The overheat detection circuit 13₁ has a comparator 130 and a reference voltage source 131.

A non-inversion input terminal of the comparator 130 is connected to the output node of the temperature sensing circuit 12 and the test terminal 22, and an inversion input terminal thereof receives a first voltage being a voltage of the reference voltage source 131. A signal output from the comparator 130 thus becomes the output stop signal ST.

The voltage detection circuit $14_1$ has a comparator 140 and a reference voltage source 141.

A non-inversion input terminal of the comparator 140 is connected to the output node of the temperature sensing circuit 12 and the test terminal 22, and an inversion input terminal thereof receives a second voltage being a voltage of the reference voltage source 141. A signal output from the comparator 140 thus becomes the test mode signal TM.

Then, the output stop signal ST is applied to the gate of the PMOS transistor 114 in the voltage output circuit $11_1$. The test mode signal TM is applied to the gate of the NMOS transistor 115 in the voltage output circuit $11_1$.

Further, the test mode signal TM is also applied to the error amplifier 111 in the voltage output circuit $11_1$.

In the present example, an overheat protection circuit is configured by the temperature sensing circuit 12, the overheat detection circuit $13_1$, and the PMOS transistor 114 (output stop circuit) in the voltage output circuit $11_1$.

When the output voltage of the temperature sensing circuit 12 becomes lower than the first voltage being the voltage of the reference voltage source 131 or a voltage lower than the first voltage is applied to the test terminal 22 as a test signal TE where the overheat protection circuit functions at the normal operation or when the overheat protection circuit is tested, the output stop signal ST being the output of the comparator 130 becomes a low level (active level). The PMOS transistor 114 thereby turns on.

At this time, since the test mode signal TM being the output of the comparator 140 also becomes a low level, the NMOS transistor 115 turns off.

Accordingly, since the gate of the output transistor 110 becomes a high level, the output transistor 110 turns off. The output of the voltage output circuit $11_1$ is then stopped.

The overheat protection circuit can thus be made to function at the normal operation or brought into a test state.

On the other hand, in the test mode for switching the voltage of the output terminal 21 in the voltage regulator 10 from the internal voltage to the external voltage Vin, a voltage higher than the second voltage being the voltage of the reference voltage source 141 is applied to the test terminal 22. The test mode signal TM being the output of the comparator 140 thereby becomes a high level (active level). Consequently, the NMOS transistor 115 turns on.

Also, the test mode signal TM of the high level is also applied to the error amplifier 111. The error amplifier 111 stops operating based on the test mode signal TM.

Further, at this time, since the output stop signal ST being the output of the comparator 130 also becomes a high level, the PMOS transistor 114 turns off.

The gate of the output transistor 110 becomes a low level (ground voltage), and hence the largest voltage in the voltage regulator 10 is applied between the gate and source of the output transistor 110. It is thus possible to perform a stress test of the output transistor 110.

Further, the external voltage Vin applied to the input terminal 20 is supplied to the output terminal 21 being the drain of the output transistor 110 as an output voltage. A stress test of an external circuit (not illustrated) connected to the output terminal 21 can thus also be performed.

A voltage detection circuit $14_2$ being a second specific example of the voltage detection circuit 14 in the voltage regulator 10 illustrated in FIG. 1 will next be described using FIG. 4.

Figure 4:
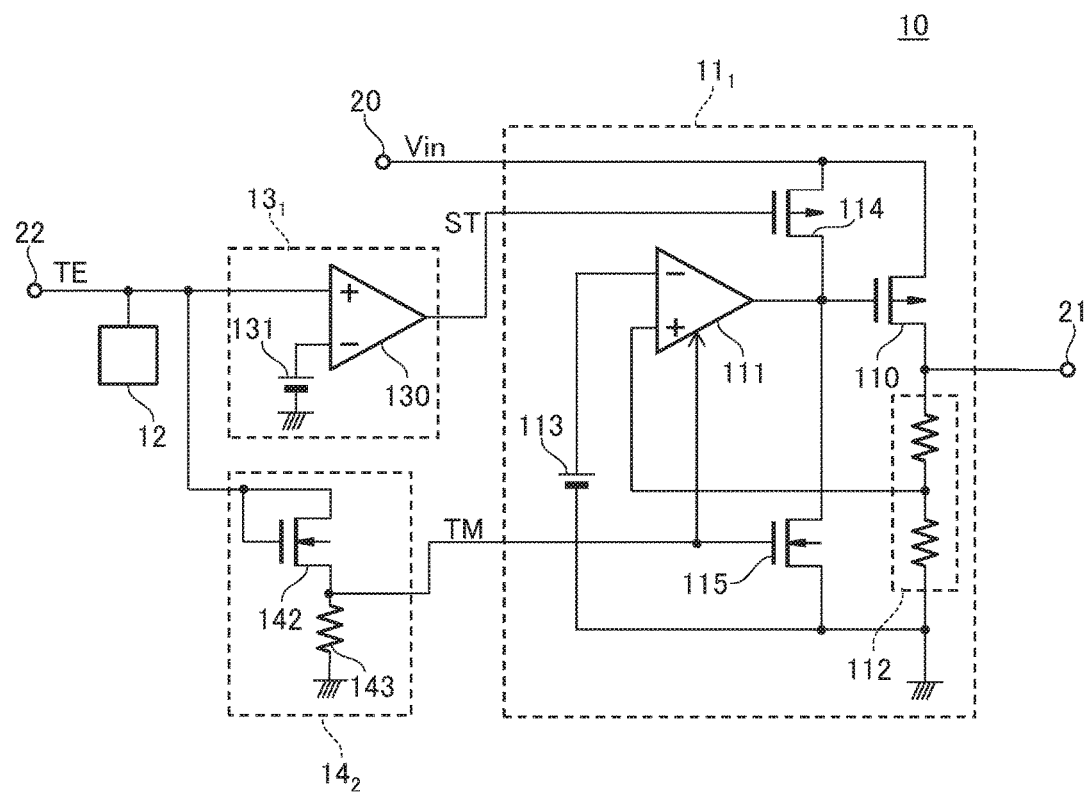
FIG. 4 is a circuit diagram illustrating a second specific example of the voltage detection circuit in the voltage regulator illustrated in FIG. 1.

As illustrated in FIG. 4, the voltage detection circuit $14_2$ in the present example has an NMOS transistor 142 whose gate and drain are connected to the test terminal 22, and a resistor 143 connected between a source of the NMOS transistor 142 and the ground terminal. Then the test mode signal TM is generated at the source of the NMOS transistor 142.

Since other respects are the same as those in the voltage regulator 10 illustrated in FIG. 3, the same reference numerals are respectively attached to the same components, and redundant description will be omitted as appropriate.

In the present example, since the voltage detection circuit $14_2$ is configured as described above, the second voltage is determined by a threshold voltage of the NMOS transistor 142 and a threshold voltage of the NMOS transistor 115 in the voltage output circuit $11_1$.

As illustrated in FIG. 2, when the temperature sensing circuit 12 is configured using the diode element, the upper limit of an output voltage of the temperature sensing circuit 12 becomes about 0.9V.

Accordingly, the second voltage is required to be 0.9V or more. In this case, a heteropolar gate MOS transistor having a P-type gate is preferably adopted as the NMOS transistor 142. Since it is easy to set a threshold voltage of the heteropolar gate MOS transistor higher than a threshold voltage of a normal MOS transistor, it becomes easy to reliably set the second voltage to 0.9V or more by adopting it.

A voltage output circuit $11_2$ being a second specific example of the voltage output circuit 11 in the voltage regulator 10 illustrated in FIG. 1 will next be described using FIG. 5.

The voltage output circuit $11_2$ of the present example is suitably used where an external voltage Vin applied to an input terminal 20 is a particularly high voltage. On the contrary the voltage output circuit $11_1$ illustrated in FIGS. 3 and 4 has a risk of the break of the output transistor when the external voltage Vin is high. That is, when the voltage of the gate of the output transistor 110 greatly fluctuates to decrease up to the voltage close to the ground voltage, the voltage between the gate and source of the output transistor 110 exceeds its withstand voltage, leading to a break of the output transistor 110.

On the other hand, according to the voltage output circuit $11_2$, such a problem can be avoided.

Figure 5:
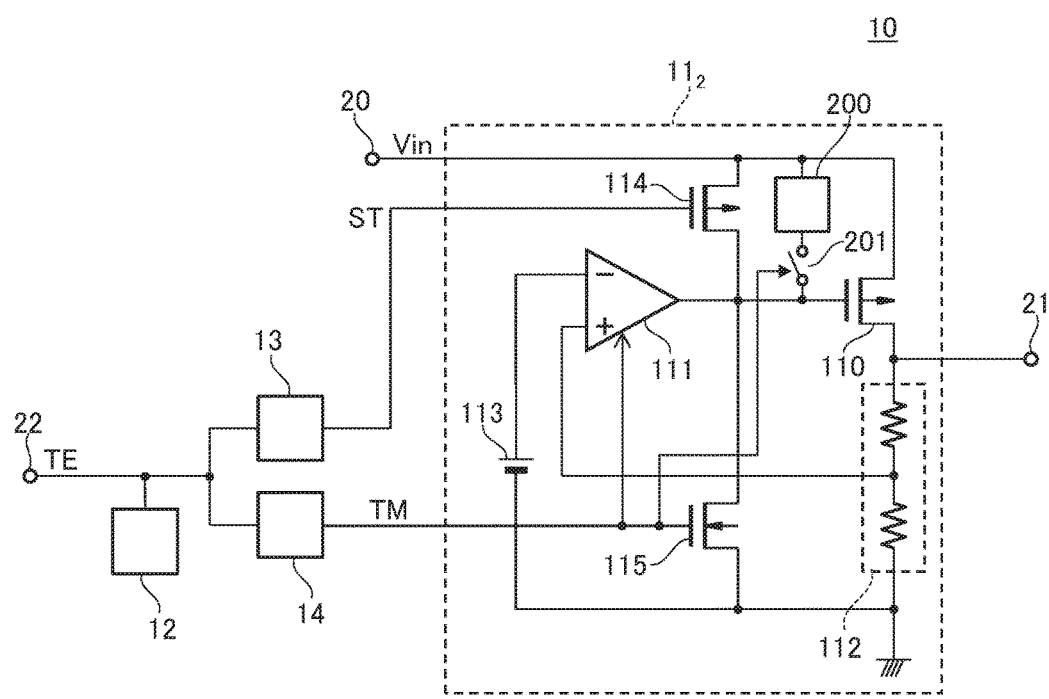
FIG. 5 is a circuit diagram illustrating a second specific example of the voltage output circuit in the voltage regulator illustrated in FIG. 1.

As compared with the voltage output circuit $11_1$ illustrated in FIGS. 3 and 4, as illustrated in FIG. 5, the voltage detection circuit $11_2$ in the present example further has a clamp circuit 200 and a switch 201 connected in series between the input terminal 20 and the gate of the output transistor 110. The switch 201 turns off when the test mode signal TM becomes a high level (active level).

Since other respects are the same as those in the voltage output circuit $11_1$ illustrated in each of FIGS. 3 and 4, the same reference numerals are respectively attached to the same components, and redundant description will be omitted as appropriate.

With this configuration, in the normal state in which the switch 201 is on state, the clamp circuit 200 clamps a voltage of the gate of the output transistor 110 so that the voltage of the gate thereof does not fall below a prescribed voltage.

Thus, it is possible to prevent the voltage between the gate and source of the output transistor 110 from exceeding its withstand voltage.

On the other hand, when the voltage regulator 10 is set to the test mode, the test mode signal TM becomes a high level (active level), so that the switch 201 turns off to stop clamping.

According to the present example, it is thus possible to prevent application of a large voltage between the gate and source of the output transistor 110 at the normal operation without giving any influence in the test mode.

A voltage output circuit $11_3$ being a third specific example of the voltage output circuit 11 in the voltage regulator 10 illustrated in FIG. 1 will next be described using FIG. 6. The voltage output circuit $11_3$ in the present example is added with the function of suppressing an overshoot of a voltage of an output terminal 21.

Figure 6:
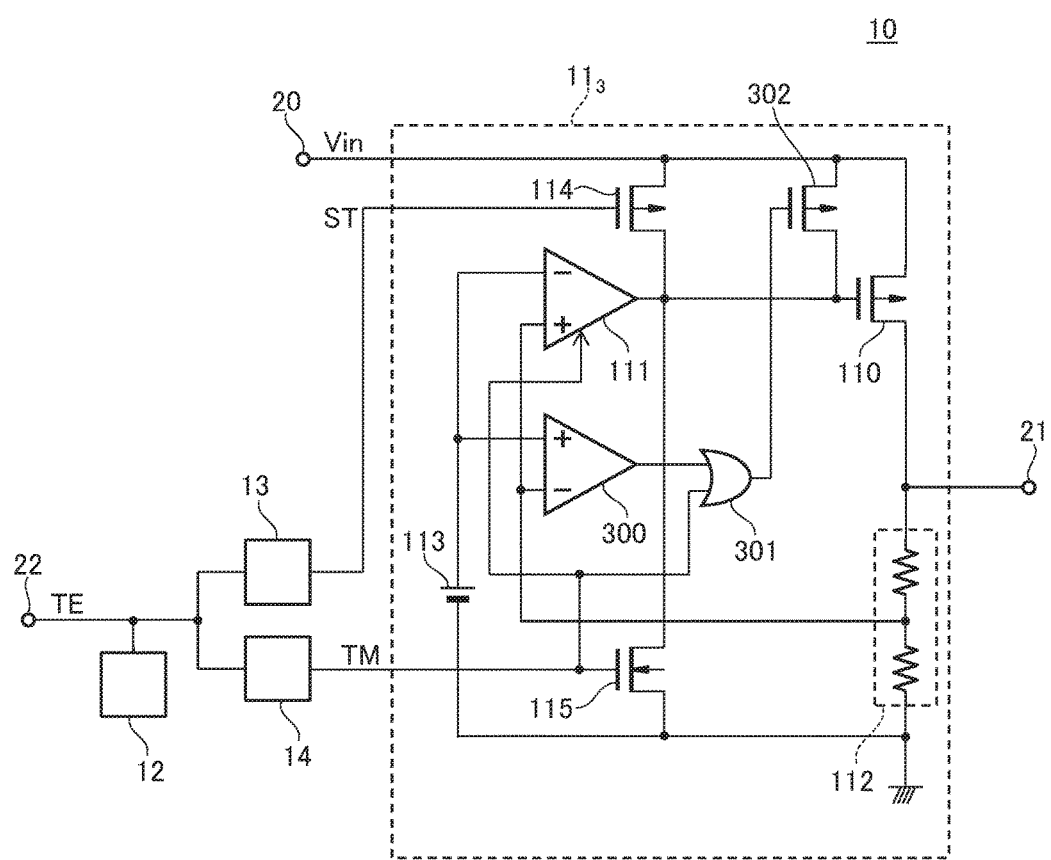
FIG. 6 is a circuit diagram illustrating a third specific example of the voltage output circuit in the voltage regulator illustrated in FIG. 1.

As compared with the voltage output circuit $11_1$ illustrated in FIGS. 3 and 4, as illustrated in FIG. 6, the voltage output circuit $11_3$ in the present example further has a comparator 300, an OR circuit (logic circuit) 301, and a PMOS transistor 302 which functions as an overshoot suppression circuit.

The comparator 300 has a non-inversion input terminal received the voltage of the reference voltage source 113, and an inversion input terminal received the divided voltage divided by the resistance voltage dividing circuit 112. The non-inversion input terminal of the comparator 300 is provided with an offset.

The OR circuit 301 is received an output of the comparator 300 and the test mode signal TM.

The PMOS transistor 302 has a source connected to the input terminal 20, a drain connected to the gate of the output transistor 110, and a gate connected to an output node of the OR circuit 301.

Since other respects are the same as those in the voltage output circuit $11_1$ illustrated in each of FIGS. 3 and 4, the same reference numerals are respectively attached to the same components, and redundant description will be omitted as appropriate.

With the above-mentioned configuration, when the overshoot occurs in the voltage of the output terminal 21, the voltage of the inversion input terminal of the comparator 300 is increased and hence the output of the comparator 300 is brought to a low level. When the OR circuit 301 receives it, the output of the OR circuit 301 becomes a low level. Accordingly, the gate of the PMOS transistor 302 becomes a low level, so that the PMOS transistor 302 turns on. Since the output transistor 110 turns off, the overshoot can thus be suppressed.

On the other hand, when the voltage regulator 10 is set to the test mode, the test mode signal TM becomes a high level, and the OR circuit 301 receives it. The output of the OR circuit 301 thus becomes a high level. Accordingly, the gate of the PMOS transistor 302 is brought to a high level, so that the PMOS transistor 302 turns off. That is, the overshoot suppression circuit is stopped.

According to the present example, it is thus possible to provide the overshoot suppression function without giving any influence in the test mode.

A voltage output circuit $11_4$ being a fourth specific example of the voltage output circuit 11 in the voltage regulator 10 illustrated in FIG. 1 will next be described using FIG. 7.

Figure 7:
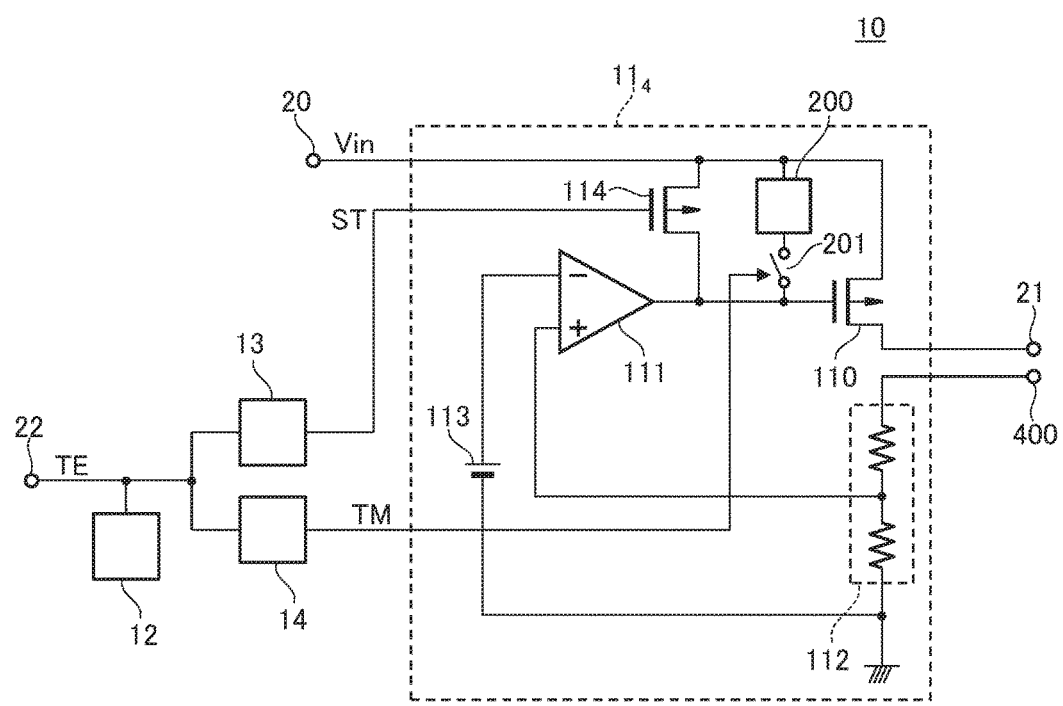
FIG. 7 is a circuit diagram illustrating a fourth specific example of the voltage output circuit in the voltage regulator illustrated in FIG. 1.

As illustrated in FIG. 7, the voltage output circuit $11_4$ in the present example is illustrated as a modification of the voltage output circuit $11_2$ illustrated in FIG. 5.

That is, as with the voltage output circuit $11_2$ illustrated in FIG. 5, the voltage output circuit $11_4$ has the clamp circuit 200 and the switch 201. In the normal state in which the switch 201 is on state, the clamp circuit 200 clamps the voltage of the gate of the output transistor 110 so that the voltage of the gate thereof does not fall below a prescribed voltage. It is thus possible to prevent the voltage between the gate and source of the output transistor 110 from exceeding its withstand voltage.

On the other hand, as compared with the voltage output circuit $11_2$ illustrated in FIG. 5, the voltage output circuit $11_4$ has a configuration in which the resistance voltage dividing circuit 112 is separated from the output terminal 21 and alternatively connected to a voltage adjustment terminal 400 provided separately from the output terminal 21 and in which the NMOS transistor 115 is deleted and no test mode signal TM is further applied to an error amplifier 111.

When the voltage regulator 10 is set to the test mode, the test mode signal TM thus becomes a high level (active level), so that the switch 201 turns off to stop clamping.

At this time, in the present example, a voltage lower than the internal voltage, e.g., the ground voltage is applied to the voltage adjustment terminal 400. The output of the error amplifier 111 thus becomes a low level (ground voltage). Accordingly, the gate of the output transistor 110 becomes a low level (ground voltage). Even in the voltage regulator 10 using the voltage output circuit 114 in the present example, the external voltage Vin applied to the external terminal 20 can be supplied to the output terminal 21, as with the voltage regulator 10 using each of the voltage output circuits $11_1$ to $11_3$ of other examples.

It is apparent that the present invention is not limited to the above embodiments, but may be modified and changed without departing from the scope and spirit of the invention.

For example, the voltage output circuit 11 may be configured to have both the configuration for clamping the voltage of the gate of the output transistor illustrated in FIG. 5, and the configuration for suppressing the overshoot illustrated in FIG. 6.

What is claimed is:

1. A voltage regulator comprising:
   a voltage output circuit configured to generate a constant internal voltage lower than an external voltage applied to an input terminal thereof and to supply the constant internal voltage to an output terminal, the voltage output circuit comprising:
   an error amplifier configured to receive a voltage based on the voltage of the output terminal and a reference voltage,
   an output transistor having a source connected to the input terminal, a drain connected to the output terminal, and a gate configured to be controlled based on a voltage supplied from the error amplifier,
   a PMOS transistor having a gate configured to receive the output stop signal, a source connected to the input terminal, and a drain connected to the gate of the output transistor, and
   an NMOS transistor having a gate configured to receive a test mode signal, a source connected to the ground terminal, and a drain connected to the gate of the output transistor;
   a comparator configured to receive a voltage based on the voltage of the output terminal and a reference voltage;
   a temperature sensing circuit configured to decrease an output voltage of an output node thereof according to a rise in temperature;

an overheat detection circuit connected to the output node of the temperature sensing circuit and to a test terminal; and a voltage detection circuit connected to the output node of the temperature sensing circuit and to the test terminal, the voltage output circuit further configured to stop supplying the constant internal voltage based on an output stop signal supplied from the overheat detection circuit according to the output voltage of the temperature sensing circuit and a voltage of the test terminal which are lower than a first voltage, and configured to output the external voltage to the output terminal based on the test mode signal supplied from the voltage detection circuit according to the voltage of the test terminal which is higher than a second voltage which is higher than both the output voltage of the temperature sensing circuit and the first voltage;

the voltage output circuit further comprising a logic circuit configured to receive an output of the comparator and the test mode signal, and an overshoot suppression circuit connected between the input terminal and the gate of the output transistor and configured to be controlled by an output of the logic circuit, the logic circuit configured to output a signal which stops the overshoot suppression circuit according to receiving of the test mode signal.

2. The voltage regulator according to claim 1, wherein the gate and drain of the NMOS transistor are connected to the test terminal, and a resistor is connected between the source of the NMOS transistor and the ground terminal, and is configured to generate the test mode signal at the source of the NMOS transistor.

3. The voltage regulator according to claim 2, wherein the NMOS transistor is a heteropolar gate MOS transistor having a P-type gate.

4. A voltage regulator comprising:
a voltage output circuit configured to generate a constant internal voltage lower than an external voltage applied to an input terminal thereof and to supply the constant internal voltage to an output terminal and comprising:
a temperature sensing circuit configured to decrease an output voltage of an output node thereof according to a rise in temperature;
an overheat detection circuit connected to the output node of the temperature sensing circuit and to a test terminal; and
a voltage detection circuit connected to the output node of the temperature sensing circuit and to the test terminal,
an error amplifier configured to receive a voltage based on the voltage of the output terminal and a reference voltage,
an output transistor having a source connected to the input terminal, a drain connected to the output terminal, and a gate configured to be controlled based on a voltage supplied from the error amplifier,
a PMOS transistor having a gate configured to receive the output stop signal, a source connected to the input terminal, and a drain connected to the gate of the output transistor, and
an NMOS transistor having a gate configured to receive a test mode signal, a source connected to the ground terminal, and a drain connected to the gate of the output transistor
a clamp circuit and a switch connected in series between the input terminal and the gate of the output transistor, the clamp circuit configured to clamp a voltage of the gate of the output transistor so that the voltage of the gate thereof does not fall below a prescribed voltage when the switch is in an on state, and the switch is configured to turn off according to receiving the test mode signal;

the voltage output circuit further configured to stop supplying the constant internal voltage based on an output stop signal supplied from the overheat detection circuit according to the output voltage of the temperature sensing circuit and a voltage of the test terminal which are lower than a first voltage, and configured to output the external voltage to the output terminal based on the test mode signal supplied from the voltage detection circuit according to the voltage of the test terminal which is higher than a second voltage which is higher than both the output voltage of the temperature sensing circuit and the first voltage.

5. The voltage regulator according to claim 4, wherein the voltage output circuit further comprises:
a comparator configured to receive a voltage based on the voltage of the output terminal and a reference voltage,
a logic circuit configured to receive an output of the comparator and the test mode signal, and
an overshoot suppression circuit connected between the input terminal and the gate of the output transistor and configured to be controlled by an output of the logic circuit,
the logic circuit configured to output a signal which stops the overshoot suppression circuit according to receiving of the test mode signal.

6. The voltage regulator according to claim 4, wherein the gate and drain of the NMOS transistor are connected to the test terminal, and a resistor is connected between the source of the NMOS transistor and the ground terminal, and is configured to generate the test mode signal at the source of the NMOS transistor.

7. The voltage regulator according to claim 6, wherein the NMOS transistor is a heteropolar gate MOS transistor having a P-type gate.

8. A voltage regulator comprising
a voltage output circuit configured to generate a constant internal voltage lower than an external voltage applied to an input terminal thereof and to supply the constant internal voltage to an output terminal,
a temperature sensing circuit configured to decrease an output voltage of an output node thereof according to a rise in temperature;
an overheat detection circuit connected to the output node of the temperature sensing circuit and to a test terminal; and
a voltage detection circuit connected to the output node of the temperature sensing circuit and to the test terminal, and configured to generate a test mode signal,
the voltage output circuit comprising:
an error amplifier configured to receive a voltage based on a voltage of a voltage adjustment terminal separate from the output terminal and a reference voltage,
an output transistor having a source connected to the input terminal, a drain connected to the output terminal, and a gate configured to be controlled based on a voltage supplied from the error amplifier,
a PMOS transistor having a gate configured to receive an output stop signal, a source connected to the input terminal, and a drain connected to the gate of the output transistor, and a clamp circuit and a switch connected in series between the input terminal and the gate of the output transistor, the clamp circuit configured to clamp a voltage of the gate of the output transistor so that the voltage of the gate of the output transistor does not fall below a prescribed voltage when the switch is in an on state, the switch is configured to turn off according to receiving of the test mode signal, and the voltage adjustment terminal configured to receive a voltage lower than the internal voltage when the voltage detection circuit outputs the test mode signal, the voltage output circuit further configured to stop supplying the constant internal voltage based on an output stop signal supplied from the overheat detection circuit according to the output voltage of the temperature sensing circuit and a voltage of the test terminal which are lower than a first voltage, and configured to output the external voltage to the output terminal based on the test mode signal supplied from the voltage detection circuit according to the voltage of the test terminal which is higher than a second voltage which is higher than both the output voltage of the temperature sensing circuit and the first voltage.

9. The voltage regulator according to 8 wherein the voltage detection circuit further comprises an NMOS transistor whose gate and drain are connected to the test terminal, and a resistor connected between a source of the NMOS transistor and a ground terminal, and is configured to generate the test mode signal at the source of the NMOS transistor.

10. The voltage regulator according to claim 9, wherein the NMOS transistor is a heteropolar gate MOS transistor having a P-type gate.

11. The voltage regulator according to claim 9, wherein the NMOS transistor is a heteropolar gate MOS transistor having a P-type gate.

12. A voltage regulator according comprising:
a voltage output circuit configured to generate a constant internal voltage lower than an external voltage applied to an input terminal thereof and to supply the constant internal voltage to an output terminal, the voltage output circuit comprising:
an error amplifier configured to receive a voltage based on the voltage of the output terminal and a reference voltage,
an output transistor having a source connected to the input terminal, a drain connected to the output terminal, and a gate configured to be controlled based on a voltage supplied from the error amplifier,
a PMOS transistor having a gate configured to receive the output stop signal, a source connected to the input terminal, and a drain connected to the gate of the output transistor, and an NMOS transistor having a gate configured to receive a test mode signal, a source connected to the ground terminal, and a drain connected to the gate of the output transistor, a temperature sensing circuit configured to decrease an output voltage of an output node thereof according to a rise in temperature;

an overheat detection circuit connected to the output node of the temperature sensing circuit and to a test terminal; and a voltage detection circuit connected to the output node of the temperature sensing circuit and to the test terminal, the voltage output circuit further configured to stop supplying the constant internal voltage based on an output stop signal supplied from the overheat detection circuit according to the output voltage of the temperature sensing circuit and a voltage of the test terminal which are lower than a first voltage, and configured to output the external voltage to the output terminal based on the test mode signal supplied from the voltage detection circuit according to the voltage of the test terminal which is higher than a second voltage which is higher than both the output voltage of the temperature sensing circuit and the first voltage, wherein the error amplifier is configured to stop operating according to receiving of the test mode signal.

13. The voltage regulator according to claim 12, wherein the gate and drain of NMOS transistor are connected to the test terminal, and a resistor is connected between a source of the NMOS transistor and a ground terminal, and is configured to generate the test mode signal at the source of the NMOS transistor.

14. The voltage regulator according to claim 12, wherein the voltage output circuit further comprises a clamp circuit and a switch connected in series between the input terminal and the gate of the output transistor, the clamp circuit configured to clamp a voltage of the gate of the output transistor so that the voltage of the gate thereof does not fall below a prescribed voltage when the switch is in an on state, and the switch is configured to turn off according to receiving the test mode signal.

15. The voltage regulator according to 12, wherein the voltage output circuit further comprises:
a comparator configured to receive a voltage based on the voltage of the output terminal and a reference voltage,
a logic circuit configured to receive an output of the comparator and the test mode signal, and
an overshoot suppression circuit connected between the input terminal and the gate of the output transistor and configured to be controlled by an output of the logic circuit,
the logic circuit configured to output a signal which stops the overshoot suppression circuit according to receiving of the test mode signal.

* * * * *